United States Patent
Li et al.

(10) Patent No.: US 8,163,620 B2
(45) Date of Patent: Apr. 24, 2012

(54) METHOD FOR ETCHING MO-BASED METAL GATE STACK WITH ALUMINIUM NITRIDE BARRIER

(75) Inventors: Yongliang Li, Beijing (CN); Qiuxia Xu, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 13/001,493

(22) PCT Filed: Sep. 21, 2010

(86) PCT No.: PCT/CN2010/001459
§ 371 (c)(1),
(2), (4) Date: Dec. 27, 2010

(87) PCT Pub. No.: WO2011/130890
PCT Pub. Date: Oct. 27, 2011

(65) Prior Publication Data
US 2011/0263114 A1    Oct. 27, 2011

(30) Foreign Application Priority Data
Apr. 21, 2010  (CN) .......................... 2010 1 0157538

(51) Int. Cl.
*H01L 21/336*  (2006.01)
*H01L 21/3205*  (2006.01)
*H01L 21/302*  (2006.01)

(52) U.S. Cl. ........ 438/287; 438/591; 438/738; 438/742; 257/E21.409; 257/E21.423

(58) Field of Classification Search .................. 438/287, 438/591, 738, 742; 257/364, 410–412, E21.409, 257/E21.423
See application file for complete search history.

(56) References Cited

U.S. PATENT DOCUMENTS

| | | | |
|---|---|---|---|
| 7,378,713 B2 | 5/2008 | Hsu et al. | |
| 2008/0090342 A1* | 4/2008 | Lee et al. | 438/158 |
| 2009/0212371 A1 | 8/2009 | Kobayashi | |
| 2010/0301429 A1* | 12/2010 | Nabatame | 257/411 |

FOREIGN PATENT DOCUMENTS

| | | |
|---|---|---|
| CN | 101091244 | 12/2007 |
| CN | 101494236 | 7/2009 |

OTHER PUBLICATIONS

Translation of the International Search Report from related Application PCT/CN2010/001459 dated Jan. 20, 2011; 5 pages.

* cited by examiner

*Primary Examiner* — Kevin Parendo
(74) *Attorney, Agent, or Firm* — Westman, Champlin & Kelly, P.A.

(57) ABSTRACT

The present application discloses a method for etching a Mo-based metal gate stack with an aluminum nitride barrier, comprising the steps of forming a $SiO_2$ interface layer, a high K dielectric layer, a Mo-based metal gate layer, an AlN barrier layer, a silicon gate layer and a hard mask in sequence on a semiconductor substrate; performing lithography on the semiconductor substrate with the $SiO_2$ interface layer, the high K dielectric layer, the Mo-based metal gate layer, the AlN barrier layer, the silicon gate layer and the hard mask using a photoresist, and etching the hard mask; removing the photoresist, and performing an anisotropic etching for silicon gate with high selectivity to the underlying AlN barrier layer and metal gate by dry etching using the hard mask; performing an anisotropic etching for the AlN barrier layer, the Mo-based metal gate layer, and the high K dielectric layer by a dry etching. With the present method for etching a Mo-based metal gate stack with an aluminum nitride barrier, a vertical etching profile will be obtained and a silicon substrate has little loss, which facilities a high K dielectric/metal gate stack integration.

7 Claims, 3 Drawing Sheets

METHOD FOR ETCHING MO-BASED METAL GATE STACK WITH ALUMINIUM NITRIDE BARRIER

CROSS-REFERENCE TO RELATED APPLICATION

This Application is a Section 371 National Stage Application of International Application No. PCT/CN2010/001459, filed Sep. 21, 2010, not yet published, the contents of which are hereby incorporated by reference in their entirety.

BACKGROUND OF THE INVENTION

1. Field of Invention

The invention relates to manufacture of an integrated circuit, in particular, to a method for etching a Mo-based metal gate stack with an aluminium nitride barrier.

2. Description of Prior Art

As critical dimension of a semiconductor device is reduced to 45 nm or beyond, it is a necessary choice to replace a conventional $SiO_2$/polysilicon gate stack with a high dielectric constant (K) dielectric/metal gate stack so as to reduce direct tunneling current and a power consumption, and avoid poly-Si gate depletion effect and reliability issue due to B penetration in a P-type metal-oxide-semiconductor field effect transistor (MOSFET), and alleviate Fermi level pinning effect.

For a nano-scale CMOS device incorporating a high K dielectridmetal gate stack, work functions of a N-type MOSFET and a P-type MOSFET should be tuned to be near a conduction band bottom (about 4.1 eV) of Si and a valence band top (about 5.2 eV) of Si respectively, for improving in a short channel effect and getting a suitable threshold. A metal gate of Mo has a low resistivity ($5 \times 10^{-6} \Omega \cdot cm$) and a high melt point (above 2600° C.). Also, Mo metal gate with (110) orientation exhibits a high work function at about 5 eV, and thus it is a competitive candidate of a gate material of a P-type MOSFET. In addition, in order to facilitate the integration of high-k dielectrics and metal gates, one widely used approach is to use a gate stack with a thin metal gate layer inserted between a high-k dielectric and polysilicon (i.e. a silicon gate/metal gate stack) in place of a pure metal gate, so that a dry etching process can performed easily and it will increase the complexity of the existing CMOS process slightly. However, Mo metal gate will react with a silicon gate if the silicon gate is directly deposited on the metal gate of Mo at a high temperature. The inventor has solved this problem by adding a barrier layer of metal nitride which has a desired thermal stability between the metal gate of Mo and the silicon gate so as to improve a thermal reliability of the gate stack. Although adding the barrier layer solves the problem of a poor thermal stability, it causes a difficulty in etching the high K dielectric/metal gate structure. Thus, the integration of the metal gate of Mo into the P-type MOSFET needs an improved etching process for a barrier layer/metal gate of Mo stacked structure.

SUMMARY OF THE INVENTION

Problem To Be Solved

An object of the present invention is to provide a method for etching a Mo-based metal gate stack with an aluminium nitride barrier in an advanced gate-first process where a high K dielectric/metal gate stacked structure is introduced into manufacture of a nano-scale CMOS device, so as to provide a high K dielectric/metal gate integration

Technical Solutions

To achieve the above object, there provides a method for etching a Mo-based metal gate stack with an aluminium nitride barrier, comprising: forming a $SiO_2$ interface layer, a high K dielectric layer, a Mo-based metal gate layer, an AlN barrier layer, a silicon gate layer and a hard mask in sequence on a semiconductor substrate;

performing lithography on the semiconductor substrate with the $SiO_2$ interface layer, the high K dielectric layer, the Mo-based metal gate layer, the AlN barrier layer, the silicon gate layer and the hard mask using a photoresist, and etching the hard mask;

removing photoresist, and then performing an anisotropic etching for silicon gate with high selectivity by dry etching using the hard mask;

performing an anisotropic etching for the AlN barrier layer, the Mo-based metal gate layer, and the high K dielectric layer by a dry etching.

In the above method, the high K dielectric layer is made of one selected from the group consisting of $HfO_2$, HfON, HfAlO, HfAlON, HfTaO, HfTaON, HfSiO, HfSiON, HfLaO and HfLaON.

In the above method, the Mo-based metal gate layer is made of one selected from the group consisting of Mo, MoN, MoAlN and a stacked structure having any two of them;

In the above method, the AlN barrier layer is formed by a physical vapor deposition and having a thickness of about 2-10 nm.

In the above method, the silicon gate layer is made of polysilicon or amorphous silicon.

In the above method, the hard mask is made of one selected from the group consisting of silicon oxide, silicon nitride and a stacked structure of them.

In the above method, the step of performing an anisotropic etching for the AlN barrier layer, the Mo-based metal gate layer, and the high K dielectric layer by a dry etching is an anisotropic and highly selective etching for the AlN barrier layer, the Mo-based metal gate layer, and the high K dielectric layer using a $BCl_3$-based etching gas.

In the above method, the $BCl_3$-based etching gas comprises one or more selected from the group consisting of $Cl_2$, $O_2$, and Ar, in addition to $BCl_3$.

In the above method, the $BCl_3$-based etching gas has a ratio of $Cl_2$: $BCl_3$ of 0 to 1:4, a ratio of $O_2$ : $BCl_3$ of 0 to 1:8, and a ratio of Ar: $BCl_3$ of 1:5 to 1:2.

In the above method, the dry etching for a stacked structure of the AlN barrier layer, the Mo-based metal gate and the high K dielectric layer is performed under the conditions of a top electrode power of about 140-450W, a bottom electrode power of about 30-120W, a chamber pressure of about 4-15 mtorr, a total flow rate of the $BCl_3$-based etching gas of about 50-130sccm, and a temperature of the chamber and the electrodes of about 50-80° C.

Beneficial Effects

With the above method, the present invention achieves the following beneficial effects.

The present method for etching a Mo-based metal gate stack with an aluminium nitride barrier layer in a gate-first process does not incur difficulties in etching due to the existence of the barrier layer, because the barrier layer is etched simultaneously with the Mo-based metal gate layer at one etching step. The etching method is highly compatible with the existing CMOS process. By optimizing the etching process for the AlN barrier layer, and the stacked structure including the Mo-based metal gate layer and the high K dielectric, a steep etching profile will be obtained and a silicon substrate has little loss, which facilities a high K dielectric/metal gate stack integration.

The present method for etching a Mo-based metal gate stack with an aluminium nitride barrier layer in a gate-first process does not increase a complexity of etching process due to the additional AlN barrier on the Mo-based metal gate layer, because the barrier layer is etched simultaneously with the Mo-based metal gate layer at one etching step.

The present method for etching a Mo-based metal gate stack with an aluminium nitride barrier layer in a gate-first process provides not only a steep etching profile, but also little loss of Si substrate, which meets the requirement for an etching process after the high K dielectric/metal gate stack is introduced into CMOS integration process.

The present method for etching a Mo-based metal gate stack with an aluminium nitride barrier layer in a gate-first process is highly compatible with the existing CMOS process.

DETAILED DESCRIPTION OF PREFERRED EMBODIMENTS

The invention will be further illustrated in detail in the following embodiments in conjunction with the accompanying drawings, so that the object, solution and advantages of the present invention are more apparent.

Figure 1:
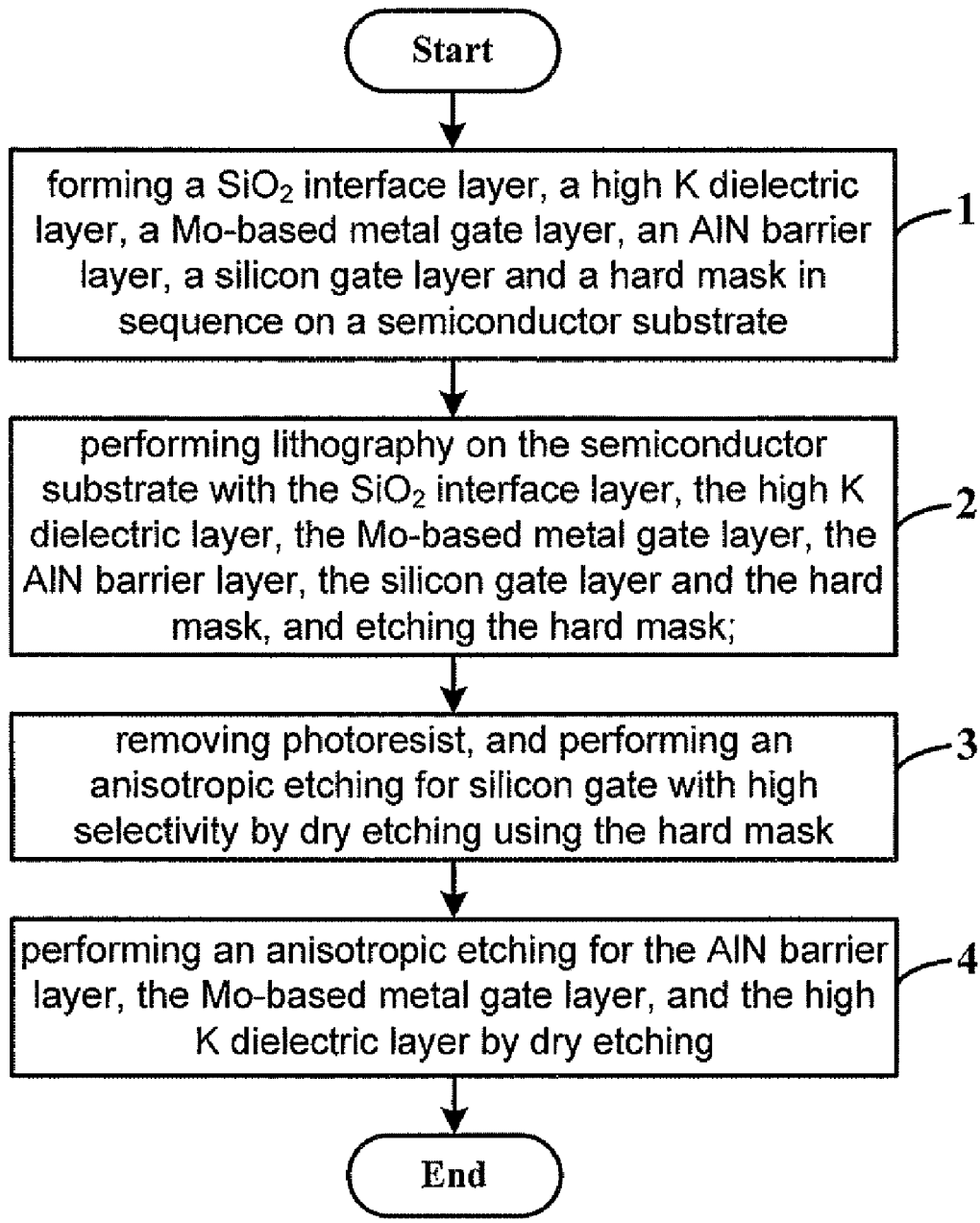
FIG. 1 is a flow chart illustrating a method of etching a Mo-based metal gate stack with an aluminium nitride barrier according to one embodiment of the present invention.

FIG. 1 is a flow chart illustrating a method of etching a Mo-based metal gate stack with an aluminium nitride barrier according to the present invention. The method comprises the following steps:

forming a $SiO_2$ layer, a high K dielectric layer, a Mo-based metal gate layer, an AlN barrier layer, a silicon gate layer and a hard mask in sequence on a semiconductor substrate;

performing lithography on the semiconductor substrate with the $SiO_2$ interface layer, the high K dielectric layer, the Mo-based metal gate layer, the AlN barrier layer, the silicon gate layer and the hard mask, and etching the hard mask;

removing the photoresist, and performing an anisotropic etching for silicon gate with high selectivity by dry etching using the hard mask;

performing an anisotropic etching for the AlN barrier layer, the Mo-based metal gate layer, and the high K dielectric layer by a dry etching.

In the above method, the high K dielectric layer is made of one selected from the group consisting of $HfO_2$, HfON, HfAlO, HfAlON, HfTaO, HfTaON, HfSiO, HfSiON, HfLaO and HfLaON. The Mo-based metal gate layer is made of one selected from the group consisting of Mo, MoN, MoAlN and a stacked structure having any two of them; The AlN barrier layer is formed by a physical vapor deposition and having a thickness of about 2-10 nm. The silicon gate layer is made of polysilicon or amorphous silicon. The hard mask is made of one selected from the group consisting of silicon oxide, silicon nitride and a stacked structure of them.

The step of performing an anisotropic etching for the AlN barrier layer, the Mo-based metal gate layer, and the high K dielectric layer by a dry etching is an anisotropic and highly selective etching for the AlN barrier layer, the Mo-based metal gate layer, and the high K dielectric layer using a $BCl_3$-based etching gas. The $BCl_3$-based etching gas comprises one or more selected from the group consisting of $Cl_2$, $O_2$, and Ar, in addition to $BCl_3$. The $BCl_3$-based etching gas has a ratio of $Cl_2$: $BCl_3$ of 0 to 1:4 a ratio of $O_2$: $BCl_3$ of 0 to 1:8, and a ratio of Ar: $BCl_3$ of 1:5 to 1:2.

The dry etching for a stacked structure of the AlN barrier layer, the Mo-based metal gate and the high K dielectric layer is performed under the conditions of a top electrode power of about 140-450W, a bottom electrode power of about 30-120W, a chamber pressure of about 4-15 mtorr, a total flow rate of the $BCl_3$-based etching gas of about 50-130 sccm, and a temperature of the chamber and the electrodes of about 50-80° C.

Figure 2:
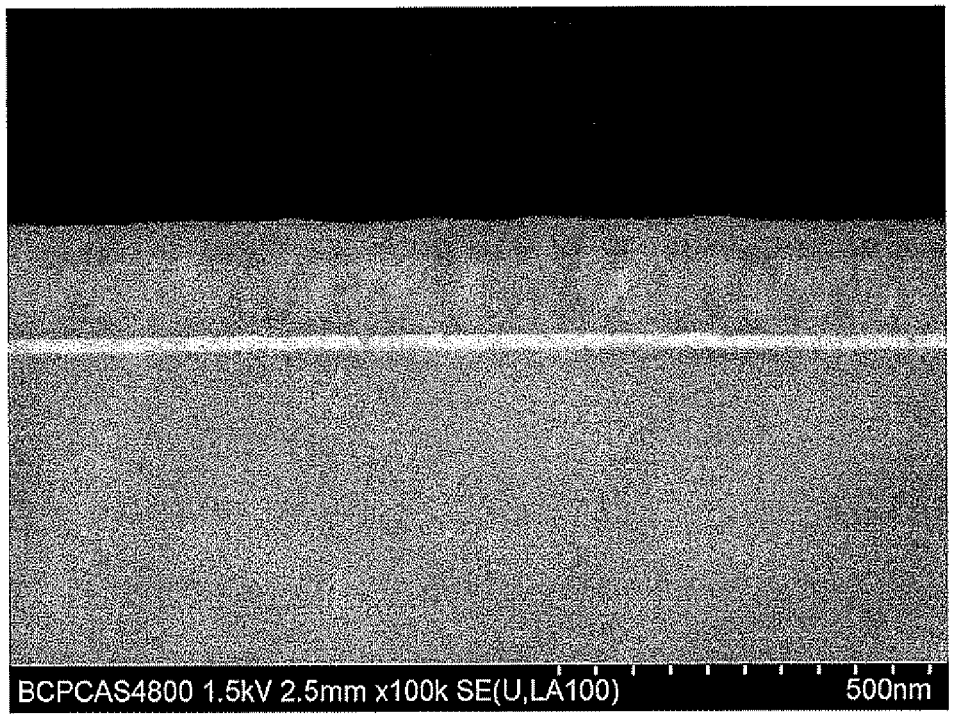
FIG. 2 shows an SEM photograph of the semiconductor structure after a MoAlN metal gate layer, an AlN barrier layer, a polysilicon gate layer and a hard mask of SiO2 are formed in sequence on a high K dielectric layer of HfSiAlON according to one embodiment of the present invention.
Figure 3:
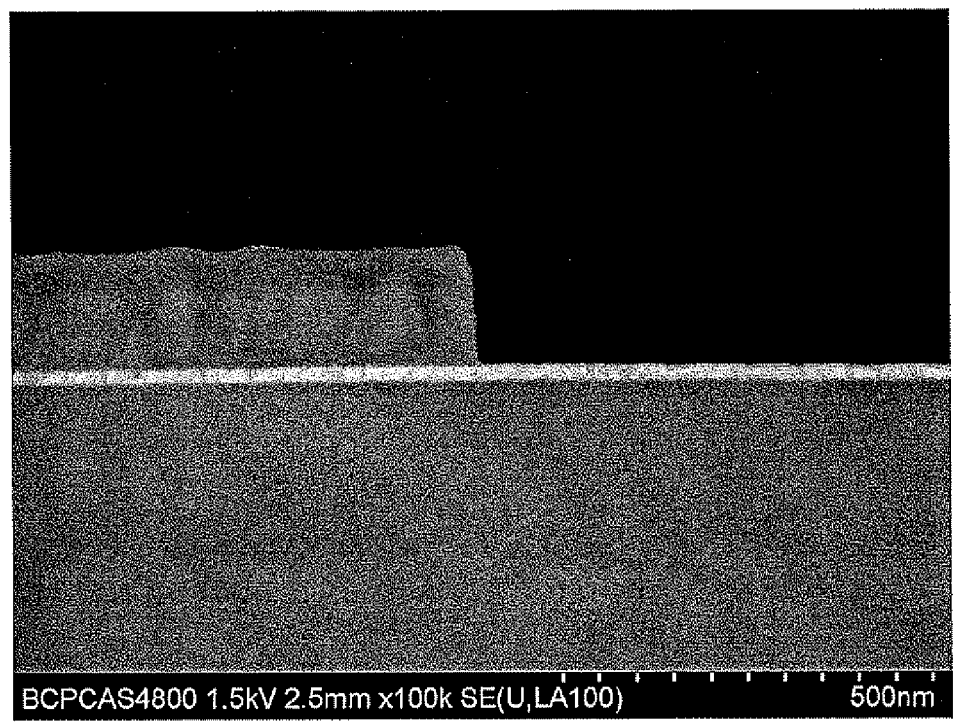
FIG. 3 shows an SEM photograph of the semiconductor structure after the polysilicon layer is etched with an optimized etching process using the hard mask according to one embodiment of the present invention.
Figure 4:
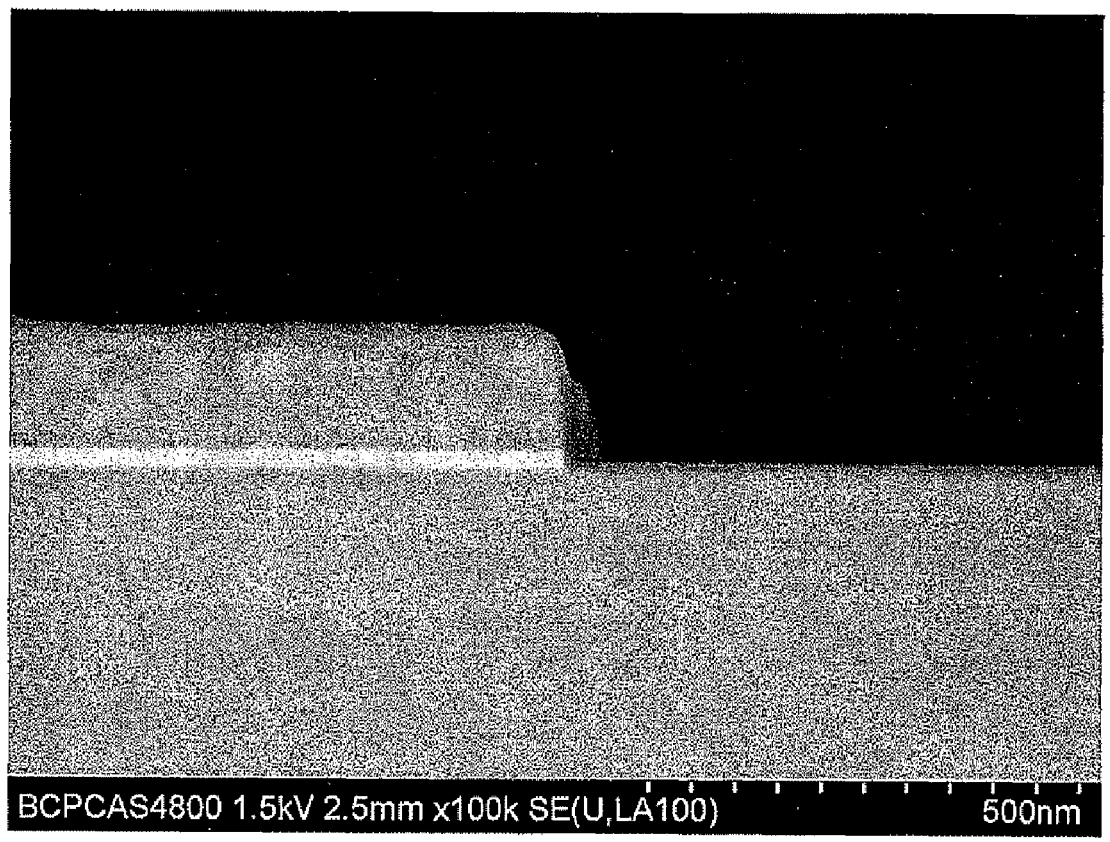
FIG. 4 shows an SEM photograph of the semiconductor structure after a stacked structure including an AlN barrier layer, a MoAlN metal gate layer and a high K dielectric layer is etched using a $BCl_3/O_2/Ar$ etching gas according to one embodiment of the present invention.

FIGS. 2 to 4 show the semiconductor structure at various stages of the method for etching the Mo-based metal gate stack with the aluminium nitride barrier according to one embodiment of the present invention, corresponding to the flow chart shown in FIG. 1.

FIG. 2 shows an SEM photograph of the semiconductor structure after a MoAlN metal gate layer, an AlN barrier layer, a polysilicon gate layer and a hard mask of $SiO_2$ are formed in sequence on a high K dielectric layer of HfSiAlON according to one embodiment of the present invention. The semiconductor structure in FIG. 2 is formed with the following steps: forming a $SiO_2$ interface layer on a Si substrate by a rapid thermal oxidation (RTO); forming a high K dielectric layer of HfSiAlON with a thickness of about 3 nm by a physical vapor deposition; performing a high-temperature treatment at about 900° C.; forming a MoAlN metal gate with a thickness of about 14 nm by a physical vapor deposition; depositing an AlN barrier layer with a thickness of about 5.0 nm in situ; forming a polysilicon layer with a thickness of about 110 nm by a low-pressure chemical vapor deposition; and forming a $SiO_2$ hard mask with a thickness of about 65 nm by a low-temperature thermal oxidation. As shown in FIG. 2, the stacked structure with a metal gate inserted between a high-k dielectric and polysilicon after the barrier layer is added has an improved thermal stability, and meets the requirement of manufacturing a semiconductor device.

FIG. 3 shows an SEM photograph of the semiconductor structure after the polysilicon layer is etched with an optimized etching process using the hard mask according to the present invention. The semiconductor structure in FIG. 3 is formed with the following steps: performing lithography on the semiconductor substrate with the $SiO_2$ interface layer, the high K dielectric layer, the Mo-based metal gate layer, the AlN barrier layer, the silicon gate layer and the hard mask using a photoresist, and etching the hard mask; removing the photoresist, and then performing an anisotropic etching for silicon gate with high selectivity by dry etching using the hard mask. As shown in FIG. 3, the etching provides a steep etching profile of polysilicon and has a high selectivity with respect to the underlying barrier layer.

FIG. 4 shows an SEM photograph of the semiconductor structure after a stacked structure including an AlN barrier layer, a MoAlN metal gate layer and a high K dielectric layer is etched using a $BCl_3/O_2/Ar$ etching gas according to one embodiment of the present invention. The semiconductor structure in FIG. 4 is formed with the following steps after those shown in FIGS. 2 and 3: etching the hard mask and the silicon gate layer by a dry etching; then etching the stacked structure including the AlN barrier layer, the MoAlN metal gate layer and the high K dielectric layer with optimize conductions such as a mixture ratio of $BCl_3/Cl_2/Ar$ etching gas, a top electrode power and a bottom electrode power, a chamber pressure, and a temperature of the chamber and the electrodes. As shown in FIG. 4, the etching process provides vertical etching profiles of polysilicon and metal gate layers and has no residue. Moreover, the etching causes little loss of Si substrate.

The present method for etching a Mo-based metal gate stack with an aluminium nitride barrier layer in a gate-first process meets the requirement of an integration of a high K dielectric/metal gate stack in a nano-scale CMOS device, which facilitates the integration of the high K dielectric/metal gate stack.

While the invention has been described with reference to specific embodiments, the description is illustrative of the invention and is not to be considered as limiting the invention. Various modifications and applications may occur for those skilled in the art without departing from the true spirit and scope of the invention as defined by the appended claims.

What is claimed is:

1. A method for etching a Mo-based metal gate stack with an aluminum nitride barrier, comprising:

forming a high K dielectric layer, a Mo-based metal gate layer, an AlN barrier layer, a silicon gate layer in sequence on a semiconductor substrate;

forming a hard mask on the silicon gate layer;

performing an anisotropic etching on the silicon gate layer by a first dry etching using the hard mask; and performing an anisotropic etching on the AlN barrier layer, the Mo-based metal gate layer, and the high K dielectric layer by a second dry etching using the hard mask and a $BCl_3$-based etching gas having high selectivity for the ALN barrier layer, the Mo-based metal gate layer, and the high K dielectric layer;

wherein the $BCl_3$-based etching gas has a ratio of $Cl_2$: $BCl_3$ of 0 to 1:4, a ratio of $O_2$: $BCl_3$ of 0 to 1:8, and a ratio of Ar: $BCl_3$ of 1:5 to 1:2.

2. The method for etching the Mo-based metal gate stack with the aluminum nitride barrier according to claim 1, wherein the high K dielectric layer is made of at least one selected from the group consisting of $HfO_2$, HfON, HfAlO, HfAlON, HfTaO, HfTaON, HfSiO, HfSiON, HfLaO and HfLaON.

3. The method for etching the Mo-based metal gate stack with the aluminum nitride barrier according to claim 1, wherein the Mo-based metal gate layer is made of at least one selected from the group consisting of Mo, MoN, and MoAlN, and a stacked structure comprising any two of Mo, MoN, and MoAlN.

4. The method for etching the Mo-based metal gate stack with the aluminum nitride barrier according to claim 1, wherein the AlN barrier layer is formed by physical vapor deposition and has a thickness of about 2-10 nm.

5. The method for etching the Mo-based metal gate stack with the aluminum nitride barrier according to claim 1, wherein the silicon gate layer is made of polysilicon or amorphous silicon.

6. The method for etching the Mo-based metal gate stack with the aluminum nitride barrier according to claim 1, wherein the hard mask is made of at least one selected from the group consisting of silicon oxide and silicon nitride, and a stacked structure of the silicon oxide and the silicon nitride.

7. The method for etching the Mo-based metal gate stack with the aluminum nitride barrier according to claim 1, wherein the second dry etching on the AlN barrier layer, the Mo-based metal gate and the high K dielectric layer is performed under the conditions of a top electrode power of about 140-450W, a bottom electrode power of about 30-120W, a chamber pressure of about 4-15 mtorr, a total flow rate of the $BCl_3$-based etching gas of about 50-130 sccm, and a temperature of the chamber and the electrodes of about 50-80°C.

* * * * *